United States Patent
Low et al.

(10) Patent No.: US 6,486,002 B1
(45) Date of Patent: Nov. 26, 2002

(54) TAPE DESIGN TO REDUCE WARPAGE

(75) Inventors: Qwai H. Low, Cupertino, CA (US); Ramaswamy Ranganathan, Saratoga, CA (US); Sengsooi Lim, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/894,718

(22) Filed: Jun. 27, 2001

(51) Int. Cl.[7] ........................ H01L 21/44; B05D 15/12
(52) U.S. Cl. .................. 438/108; 438/107; 438/111; 427/96; 427/282
(58) Field of Search .................... 438/108; 257/277, 257/531, 728, 778, 786; 427/96, 282

(56) References Cited

U.S. PATENT DOCUMENTS 6,224,936 B1 * 5/2001 Gochnour et al. ............ 427/96
6,310,386 B1 * 10/2001 Shenoy ........................ 257/531

* cited by examiner

Primary Examiner—David Nelms
Assistant Examiner—Reneé R. Berry
(74) Attorney, Agent, or Firm—Sawyer Law Group LLP

(57) ABSTRACT

An improved tape substrate design for a semiconductor package is disclosed. The tape substrate semiconductor package includes a plurality of die pads, a plurality of vias, and a pattern of metal traces interconnected between the die pads and the vias to form circuitry on the tape substrate. According to the method and apparatus of the present invention an extra metal layer is added at the circuitry to increase rigidity of the tape substrate, thereby reducing warpage without adding to the thickness of the tape substrate package.

5 Claims, 1 Drawing Sheet

TAPE DESIGN TO REDUCE WARPAGE

FIELD OF THE INVENTION

The present invention relates to tape substrate-based semiconductor packages, and more particularly to an improved tape substrate design that reduces warpage.

BACKGROUND OF THE INVENTION

Integrated circuits are typically packaged before they are used with other components as part of a larger electronic system. Most packages are constructed with die mounted on a substrate with bond pads on the die connected to conductive lines or traces on the surface. These substrates may be tape, ceramic, or printed circuit board laminate.

Tape substrates are very thin and are used for CSP (Chip Size Packages) and BGA (Ball Grid Arrays) semiconductor packages, which are ideal for cellular phones, and other such devices. Use of durable polyimide film makes extremely fine patterning possible, increasing circuit density.

Although tape substrates offer advantages over other types of packages, the materials comprising the package and the thinness of tape substrates create a problem when used for semiconductor packaging. The construction of a tape substrate-based package typically includes three different types of materials, namely, a substrate comprising kapton or polyimide film, copper circuits having a plating of nickel/gold, and a solder mask. Each of these different materials have different coefficients of thermal expansion, and in this case, the solder mask expansion coefficient is more dominant than the others. This difference in expansion coefficient rates induces warpage of the semiconductor package during and after assembly, resulting in die cracks. Also, when used in BGA packages, the warpage results in loss of ball coplanarity.

A current solution toward solving this problem is the use of rigid substrates, which comprise Bismaleimidie Trizine (BT) or FR5. Although rigid substrates do not suffer a problem of warpage, routing density is poor with rigid substrates and overall thickness of the package is higher. Therefore, for some packaging applications, the use of rigid substrate is not a viable option.

Accordingly, what is needed is an improved tape substrate design that reduces warpage, but does not increase the overall thickness of the package. The present invention addresses such a need.

SUMMARY OF THE INVENTION

The present invention provides an improved tape substrate design for a semiconductor package. The tape substrate semiconductor package includes a plurality of die pads, a plurality of vias, and a pattern of metal traces interconnected between the die pads and the vias to form circuitry on the tape substrate. According to the method and apparatus of the present invention, an extra metal layer is added to the circuitry to increase rigidity of the tape substrate. In a preferred embodiment, the metal layer is added at the die pads, between the die pads and vias, and between the metal traces.

According to the system and method disclosed herein, the extra metal layer reduces warpage of the tape substrate package, which both minimizes die cracks and enhances coplanarity of balls in BGA packages. Furthermore, the extra metal layer does not increase the thickness of the tape substrate package.

DETAILED DESCRIPTION

The present invention relates to tape substrate-based semiconductor packages. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown but is to be accorded the widest scope consistent with the principles and features described herein.

Figure 1:
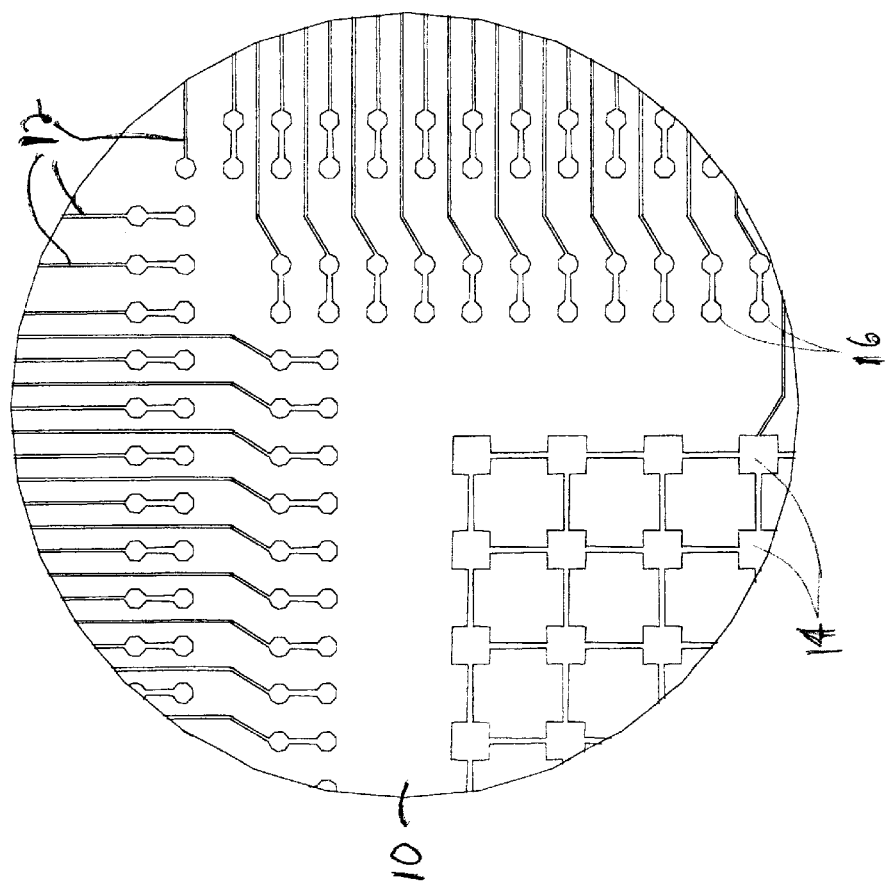
FIG. 1 is a diagram of a top view of a portion of conventional tape substrate design.

FIG. 1 is a diagram of a top view of a portion of conventional tape substrate design. The tape substrate 10 includes a pattern of metal traces 12 that are interconnected between die pads 14 and vias 16 to form a circuit on the tape. A solder mask (not shown) covers portions of the circuit. If the tape is a two-layer type, both sides of the tape substrate would include metallization and solder masks.

The metal traces 12 typically comprise copper with plating of nickel/gold, and the tape substrate 10 typically comprises kapton or a polyimide film. The copper traces 12, the tape substrate 10, and the solder mask have different coefficients of thermal expansion, with the solder mask expansion coefficient being the most dominant. Because the solder mask expands more rapidly, the semiconductor package tends to warp both during and after assembly, which results in die cracks and in loss of ball coplanarity in the case of BGA packages.

Figure 2:
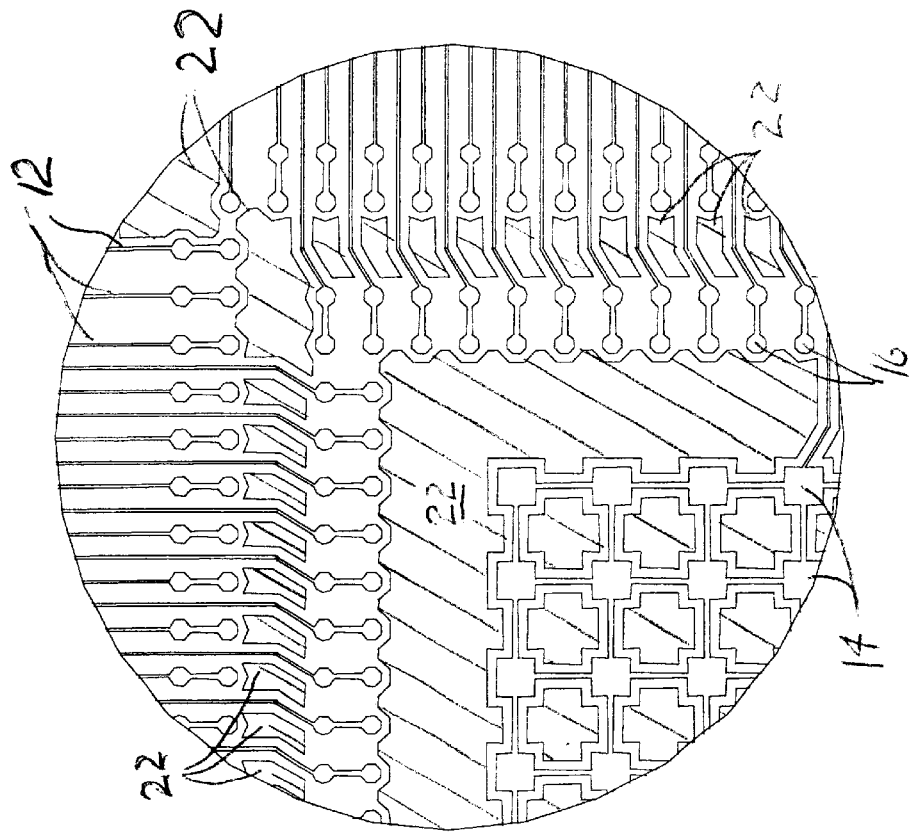
FIG. 2 is a diagram showing an improved tape substrate design in accordance with the present invention.

The present invention provides an improved tape substrate design that eliminates warpage without adding to the thickness of the package. FIG. 2 is a diagram showing an improved tape substrate design, where like components of FIG. 1 have like reference numerals. According to the present invention, the improved tape substrate design adds an additional metal layer 22 (shown by the hash marks) to the tape substrate 20 to increase the rigidity of the tape substrate 20, thereby decreasing overall warpage. The extra layer of metal 22 may be added at the die pads 14, between the die pads 14 and vias 16, and between the metal traces 12. In a preferred embodiment, the extra metal layer 22 is spaced from the circuitry components by a minimum distance of approximately 30 microns.

The extra metal layer 22 is preferably made with the same material used for the metal traces 12, and therefore may be deposited along with the metal traces 12 during fabrication so that no additional fabrication steps are required. Also, the extra metal layer 22 may be added to both the top and bottom of a two-layer tape substrate to provide rigidity balance.

Adding the additional metal layer 22 provides several advantages. The extra metal layer 22 reduces warpage, which both minimizes die cracks and enhances coplanarity of balls in BGA packages. Furthermore, the extra metal layer 22 does not increase the thickness of the tape substrate package.

The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

What is claimed is:

1. A tape substrate semiconductor package, comprising
   a plurality of die pads;
   a plurality of vias;
   a pattern of metal traces interconnected between the die pads and the vias to form circuitry on the tape substrate; and
   a metal layer added between the circuitry to increase rigidity of the tape substrate, thereby reducing warpage without adding to the thickness of the tape substrate package.

2. The package of claim 1 wherein the metal layer is added at the die pads, between the die pads and vias, and between the metal traces.

3. The package of claim 2 wherein the metal layer is spaced from the circuitry by a minimum distance of approximately 30 microns.

4. The package of claim 3 wherein the metal layer is made with a same material used for the metal traces, and is deposited along with the metal traces during fabrication so that no additional fabrication steps are required.

5. The package of claim 4 wherein the tape substrate has two-layers and wherein the metal layer is added to both sides of the tape substrate to provide rigidity balance.

* * * * *